United States Patent
Alptekin et al.

(10) Patent No.: US 9,236,345 B2
(45) Date of Patent: Jan. 12, 2016

(54) OXIDE MEDIATED EPITAXIAL NICKEL DISILICIDE ALLOY CONTACT FORMATION

(71) Applicant: GLOBALFOUNDRIES INC., Grand Cayman (KY)

(72) Inventors: Emre Alptekin, Wappingers Falls, NY (US); Nicolas L. Breil, Wappingers Falls, NY (US); Christian Lavoie, Pleasantville, NY (US); Ahmet S. Ozcan, Pleasantville, NY (US); Kathryn T. Schonenberg, Wappingers Falls, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/223,592

(22) Filed: Mar. 24, 2014

(65) Prior Publication Data

US 2015/0270222 A1 Sep. 24, 2015

(51) Int. Cl.
| | |
|---|---|
| H01L 29/78 | (2006.01) |
| H01L 23/532 | (2006.01) |
| H01L 27/092 | (2006.01) |
| H01L 23/535 | (2006.01) |
| H01L 29/423 | (2006.01) |
| H01L 29/417 | (2006.01) |
| H01L 21/285 | (2006.01) |

(52) U.S. Cl.
CPC .... *H01L 23/53209* (2013.01); *H01L 21/28518* (2013.01); *H01L 21/28568* (2013.01); *H01L 23/535* (2013.01); *H01L 27/092* (2013.01); *H01L 29/41766* (2013.01); *H01L 29/42364* (2013.01); *H01L 29/78* (2013.01)

(58) Field of Classification Search
None
See application file for complete search history.

(56) References Cited

U.S. PATENT DOCUMENTS

| | | | |
|---|---|---|---|
| 6,346,465 | B1 | 2/2002 | Miura et al. |
| 6,468,901 | B1 | 10/2002 | Maa et al. |
| 7,253,071 | B2 | 8/2007 | Lee |
| 8,101,518 | B2 | 1/2012 | Cabral, Jr. et al. |
| 8,338,239 | B2 | 12/2012 | Chang et al. |
| 2002/0111021 | A1 | 8/2002 | Paton et al. |
| 2007/0059878 | A1 | 3/2007 | Chang et al. |

(Continued)

FOREIGN PATENT DOCUMENTS

| | | |
|---|---|---|
| JP | 2002124487 | 4/2002 |
| JP | 200994395 | 4/2009 |
| JP | 2012151230 | 8/2012 |

OTHER PUBLICATIONS

International Search Report dated May 26, 2015.
Loomans, M.E., et al., "Monosilicide-Disilicide-Silicon Phase Equilibria in the Nickel—Platinum—Silicon and Nickel—Palladium—Silicon Systems", Metallurgical and Materials Transactions A, Oct. 2004, vol. 35A, pp. 3053-3061.

(Continued)

*Primary Examiner* — Khaja Ahmad
(74) *Attorney, Agent, or Firm* — Scully, Scott, Murphy & Presser, P.C.

(57) ABSTRACT

Contact openings are formed into a dielectric material exposing a surface portion of a semiconductor substrate. An interfacial oxide layer is then formed in each contact opening and on an exposed surface portion of the interfacial oxide layer. A NiPt alloy layer is formed within each opening and on the exposed surface portion of each interfacial oxide layer. An anneal is then performed that forms a contact structure of, from bottom to top, a nickel disilicide alloy body having an inverted pyramidal shape, a Pt rich silicide cap region and an oxygen rich region. A metal contact is then formed within each contact opening and atop the oxygen rich region of each contact structure.

12 Claims, 11 Drawing Sheets

(56) References Cited

U.S. PATENT DOCUMENTS

| | | | |
|---|---|---|---|
| 2007/0093047 A1* | 4/2007 | Okuno | H01L 21/28052 438/592 |
| 2007/0134898 A1 | 6/2007 | Takeoka et al. | |
| 2007/0181954 A1 | 8/2007 | Oikawa | |
| 2007/0202692 A1 | 8/2007 | Watanabe et al. | |
| 2008/0121950 A1 | 5/2008 | Yamaguchi et al. | |
| 2010/0224938 A1* | 9/2010 | Zhu | H01L 21/823807 257/369 |
| 2012/0074501 A1 | 3/2012 | Ellis-Monaghan et al. | |
| 2013/0119483 A1* | 5/2013 | Alptekin | H01L 29/7833 257/408 |

OTHER PUBLICATIONS

Kashihara, K., et al., "Mechanism of Nickel Disilicide Growth Caused by RIE Plasma-Induced Damage on Silicon Substrate", Junction Technology, May 15-16, 2008. IWJT '08. Extended Abstracts 2008, 8th, International workshop on Digital Object Identifier: Publication Year: 2008, pp. 154-157.

Lim, P.S.Y, et al., "NiSi2 formation through annealing of nickel and dysprosium stack on Si(100) and impact on effective Schottky barrier height", Journal of Applied Physics, published online Jan. 7, 2013 113, 013712.

* cited by examiner

OXIDE MEDIATED EPITAXIAL NICKEL DISILICIDE ALLOY CONTACT FORMATION

BACKGROUND

The present application relates to semiconductor structures and methods of forming the same. More particularly, the present application relates to semiconductor structures including at least one nickel disilicide alloy contact having an inverted pyramidal shape. The present application also provides methods of forming such semiconductor structures.

Field effect transistors (FETs) are the basic building block of today's integrated circuits. Such transistors can be formed in conventional bulk substrates (such as silicon) or in semiconductor-on-insulator (SOI) substrates.

State of the art FETs can be fabricated by depositing a gate conductor over a gate dielectric and a semiconductor substrate. Generally, the FET fabrication process implements lithography and etching processes to define the gate structures. After providing the gate structures, source/drain extensions are formed into a portion of the semiconductor substrate and on both sides of each gate structure by ion implantation. Sometimes this implant is performed using a spacer to create a specific distance between the gate structure and the implanted junction. In some instances, such as in the manufacture of an n-FET device, the source/drain extensions for the n-FET device are implanted with no spacer. For a p-FET device, the source/drain extensions are typically implanted with a spacer present. A thicker spacer is typically formed after the source/drain extensions have been implanted. In some instances, deep source/drain implants can be performed with the thick spacer present. In other instances, and for advanced technologies, the source region and the drain region can be formed using a selective epitaxial growth process. High temperature anneals can be performed to activate the junctions after which the source/drain and top portion of the gate are generally converted into a metal semiconductor alloy (i.e., a metal silicide). The formation of the metal semiconductor alloy typically requires that a transition metal be deposited on the semiconductor substrate followed by a process to produce the metal semiconductor alloy. Such a process forms metal semiconductor alloy contacts to the deep source/drain regions.

Metal semiconductor alloy contact resistance contributes to an ever larger portion of the total parasitic resistance in advanced complementary metal oxide semiconductor (CMOS) devices for current 20 nm and 14 nm technology nodes. Thus, there is a need for providing metal semiconductor alloys in which the contact resistance is reduced.

SUMMARY

Contact openings are formed into a dielectric material exposing a surface portion of a semiconductor substrate. An interfacial oxide layer is then formed in each contact opening and on an exposed surface portion of the interfacial oxide layer. A NiPt alloy layer is formed within each opening and on the exposed surface portion of each interfacial oxide layer. An anneal is then performed that forms a contact structure of, from bottom to top, a nickel disilicide alloy body having an inverted pyramidal shape, a Pt rich silicide cap region and an oxygen rich region. A metal contact is then formed within each contact opening and atop the oxygen rich region of each contact structure.

In one aspect of the present application, a semiconductor structure including at least one contact structure having improved contact resistance is provided. In one embodiment, the semiconductor structure of the present application includes a substrate having a source region and a drain region located within a Si-containing semiconductor material portion of a device region of the substrate, wherein the source region and the drain region are spaced apart by a channel region. The structure of the present application further includes a functional gate structure located above the channel region and a dielectric material located on each side of the functional gate structure. Contact openings are located in the dielectric material and extend to the source region and the drain region. A source-side contact structure is located within one of the contact openings and in contact with the source region, and a drain-side contact structure is located within another of the contact openings and in contact with the drain region. In accordance with the present application, the source-side contact structure and the drain-side contact structure each comprises, from bottom to top, a nickel disilicide alloy body having an inverted pyramidal shape, a Pt rich silicide cap region and an oxygen rich region.

In another embodiment of the present application, the semiconductor structure of the present application may further include another device region located adjacent the device region containing the functional gate structure. The another device region includes another Si-containing semiconductor material portion of the substrate having another source region and another drain region located within the another Si-containing semiconductor material portion, wherein the another source region and the another drain region are spaced apart by another channel region. Another functional gate structure is located above the another channel region, and the dielectric material is located on each side of the another functional gate structure. Other contact openings are located in the dielectric material and extend to the another source region and the another drain region. Another source-side contact structure is located within one of the other contact openings and in contact with the another source region, and another drain-side contact structure is located within another of the other contact openings and in contact with the another drain region. In accordance with the present application, the another source-side contact structure and the another drain-side contact structure each comprises a nickel monosilicide alloy body.

In another aspect of the present application, a method of forming a contact structure is provided. In one embodiment, the method includes providing a structure including contact openings in a dielectric material that extend to an uppermost surface of a source region and a drain region that are located in a substrate. Next, an interfacial oxide layer is formed within each of the contact openings and on the source region and on the drain region. A NiPt alloy layer is then formed on the interfacial oxide layer within each of the contact openings. Next, the structure including the NiPt alloy layer is annealed to form a contact structure in each of the contact openings, wherein each contact structure comprises, from bottom to top, a nickel disilicide alloy body having an inverted pyramidal shape, a Pt rich silicide cap region and an oxygen rich region.

In another embodiment, the method includes providing a structure including contact openings in a dielectric material that extend to an uppermost surface of a source region and a drain region that are located in first device region of a substrate and other contact openings in the dielectric material that extend to an uppermost surface of another source region and another drain region that are located in a second device region of the substrate. Next, an interfacial oxide layer is provided within each of the contact openings and on each source region and on each drain region in the first device region, but not the second device region. Next, a NiPt alloy layer is formed on the interfacial oxide layer within each of the contact openings in the first device region and on exposed surfaces of the another source region and the another drain region in the second device region. The structure including the NiPt alloy layer is then annealed to form a first contact structure in each of the contact openings in the first device region and to form a second contact structure in each of the other contact openings in the second device region. Each first contact structure comprises, from bottom to top, a nickel disilicide alloy body having an inverted pyramidal shape, a Pt rich silicide cap region and an oxygen rich region, while each second contact structure comprises a nickel mono silicide body.

The above methods may be implemented in a gate-first or a gate last processing flow.

DETAILED DESCRIPTION

Figure 1:
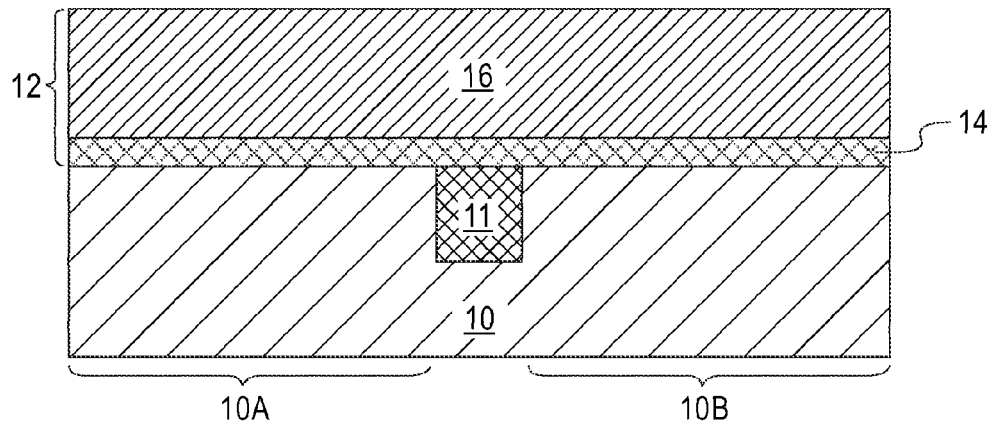
FIG. 1 is a cross sectional view of a first exemplary semiconductor structure including a material stack located on an uppermost surface of Si-containing semiconductor substrate that includes at least a first device region and a second device region in accordance with an embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

The present application generally provides a method of forming a contact structure to the source and drain region of at least one functional gate structure. The contact structure of the present application includes, from bottom to top, a nickel disilicide alloy body having an inverted pyramidal shape, a Pt rich silicide cap region and an oxygen rich region. The term "Pt rich silicide cap region" is used throughout the present application to denote a silicide region having a Pt concentration between 30% and 100%. The term "oxygen rich region" denotes a region that may contain between 30 and 60% oxygen. The term "inverted pyramid" denotes that the nickel disilicide alloy body has a triangular shape including a base portion that is located above a tip portion; the base portion and the tip portion are connected to each other by sidewall portions. Typically, but not necessarily always, the contact structure of the present application is formed only in a device region of a substrate in which n-FETs will be formed. The following two examples represent some embodiments of the present invention in which the inventive contact structure is formed only within an n-FET device region, but not a p-FET device region. In some cases, however, the inventive contact structure can be formed within both the n-FET device region and the p-FET device region of the substrate.

Referring first to FIG. 1, there is illustrated a first exemplary semiconductor structure including a material stack 12 located on an uppermost surface of silicon (Si)-containing semiconductor substrate 10 in accordance with an embodiment of the present application. The material stack 12 includes, from bottom to top, a gate dielectric material 14 and a gate conductor 16. The semiconductor structure shown in FIG. 1 also includes a first device region 10A and a second device region 10B which are spaced apart by an isolation structure 11.

In some embodiments of the present application, the Si-containing semiconductor substrate 10 can be a bulk semiconductor substrate. When a bulk semiconductor substrate is employed as Si-containing semiconductor substrate 10, the bulk semiconductor substrate can be comprised of any silicon-containing semiconductor material including, but not limited to, pure, i.e., unalloyed, silicon, or a silicon alloy such as, for example, SiGe, SiC, and SiGeC. In some embodiments, multilayers of these Si-containing semiconductor materials can also be used as the semiconductor material of the bulk semiconductor. In other embodiments, the Si-containing material or materials can be located atop a non-silicon-containing semiconductor material such as, for example, pure germanium, or an III-V compound semiconductor. In one embodiment, the Si-containing semiconductor substrate 10 can be comprised of a single crystalline Si-containing semiconductor material, such as, for example, single crystalline silicon. In other embodiments, the Si-containing semiconductor substrate 10 may comprise a polycrystalline or amorphous Si-containing semiconductor material.

In another embodiment, a semiconductor-on-insulator (SOI) substrate (not specifically shown) can be employed as the Si-containing semiconductor substrate 10. Although not specifically shown, one skilled in the art understands that an SOI substrate includes a handle substrate, a buried insulator layer located on an upper surface of the handle substrate, and a Si-containing semiconductor layer located on an uppermost surface of the buried insulator layer. The handle substrate provides mechanical support for the buried insulator layer and the semiconductor layer.

The handle substrate and the Si-containing semiconductor layer of the SOI substrate may comprise the same, or different, semiconductor material. The term "semiconductor" as used herein in connection with the semiconductor material of the handle substrate denotes any semiconductor material including, for example, Si, Ge, SiGe, SiC, SiGeC, and III/V compound semiconductors such as, for example, InAs, GaAs, or InP. Multilayers of these semiconductor materials can also be used as the semiconductor material of the handle substrate. The Si-containing layer of the SOI substrate may comprise unalloyed silicon or a silicon alloy such as, for example, SiGe, SiC, SiGeC. In one embodiment, the handle substrate and the Si-containing semiconductor layer are both comprised of silicon. In some embodiments, the handle substrate is a non-semiconductor material including, for example, a dielectric material and/or a conductive material. In yet other embodiments, the handle substrate can be omitted and a substrate including an insulator layer and a Si-containing semiconductor layer can be used as Si-containing semiconductor substrate 10.

In some embodiments, the handle substrate and the Si-containing semiconductor layer may have the same or different crystal orientation. For example, the crystal orientation of the handle substrate and/or the Si-containing semiconductor layer may be {100}, {110}, or {111}. Other crystallographic orientations besides those specifically mentioned can also be used in the present application. The handle substrate and/or the Si-containing semiconductor layer of the SOI substrate may be a single crystalline semiconductor material, a polycrystalline material, or an amorphous material. Typically, at least the Si-containing semiconductor layer is a single crystalline semiconductor material. In some embodiments, the Si-containing semiconductor layer that is located atop the buried insulator layer can be processed to include semiconductor regions having different crystal orientations.

The buried insulator layer of the SOI substrate may be a crystalline or non-crystalline oxide or nitride. In one embodiment, the buried insulator layer is an oxide such as, for example, silicon dioxide. The buried insulator layer may be continuous or it may be discontinuous. When a discontinuous buried insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the Si-containing semiconductor layer to a layer having a thickness that is more desirable.

In one example, the thickness of the Si-containing semiconductor layer of the SOI substrate can be from 100 Å to 1000 Å. In another example, the thickness of the Si-containing semiconductor layer of the SOI substrate can be from 500 Å to 700 Å. In some embodiments, and when an ETSOI (extremely thin semiconductor-on-insulator) substrate is employed, the Si-containing semiconductor layer of the SOI has a thickness of less than 100 Å. If the thickness of the Si-containing semiconductor layer is not within one of the above mentioned ranges, a thinning step such as, for example, planarization or etching can be used to reduce the thickness of the Si-containing semiconductor layer to a value within one of the ranges mentioned above. The buried insulator layer of the SOI substrate typically has a thickness from 10 Å to 2000 Å, with a thickness from 1000 Å to 1500 Å being more typical. The thickness of the handle substrate of the SOI substrate is inconsequential to the present application.

In some other embodiments, hybrid semiconductor substrates which have different surface regions of different crystallographic orientations can be employed as Si-containing semiconductor substrate 10. When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

Silicon-containing semiconductor substrate 10 may be doped, undoped or contain doped and undoped regions therein. For clarity, the doped regions are not specifically shown in the drawings of the present application. Each doped region within a Si-containing semiconductor material portion of the Si-containing semiconductor substrate 10 may have the same, or they may have different conductivities and/or doping concentrations. The doped regions that are present in the Si-containing semiconductor substrate 10 are typically referred to as well regions and they are formed utilizing a conventional ion implantation process, gas phase doping or epitaxial growth.

In some embodiments, the Si-containing semiconductor substrate 10 can be processed to include at least one isolation structure 11. The at least one isolation structure 11 can be a trench isolation structure or a field oxide isolation structure. The trench isolation structure can be formed utilizing a conventional trench isolation process well known to those skilled in the art. For example, lithography, etching and filling of the trench with a trench dielectric such as an oxide may be used in forming the trench isolation structure. Optionally, a liner may be formed in the trench prior to trench fill, a densification step may be performed after the trench fill and a planarization process may follow the trench fill as well. The field oxide isolation structure may be formed utilizing a so-called local oxidation of silicon process. The at least one isolation structure 11 that is formed can provide isolation between neighboring gate structures, typically required when the neighboring gate structures have opposite conductivities, i.e., n-type transistors and p-type transistors. As such and in one example, the at least one isolation structure 11 can separate a first device region 10A in which an n-type transistor device can be formed and second device region 10B in which a p-type transistor device can be formed.

A material stack 12 is then formed on an uppermost surface of the Si-containing semiconductor substrate 10 and on an uppermost surface of each isolation structure 11. As stated above, the material stack 12 includes, from bottom to top, a gate dielectric material 14 and a gate conductor 16. The gate dielectric material 14 and the gate conductor 16 which provide material stack 12 are formed as blanket layers atop the uppermost surface of the Si-containing semiconductor substrate 10.

In this embodiment of the present application, the material stack 12 is used in providing a functional gate structure. The term "functional gate structure" is used throughout the present application as a permanent gate structure used to control output current (i.e., flow of carriers in the channel) of a semiconducting device through electrical or magnetic fields.

The gate dielectric material 14 that can be used in the present application can be a semiconductor oxide, a semiconductor nitride, and/or a semiconductor oxynitride. In one example, the gate dielectric material 14 can be composed of silicon dioxide, silicon nitride and/or silicon oxynitride. In another embodiment of the present application, the gate dielectric material 14 may include at least a dielectric metal oxide. Exemplary dielectric metal oxides that can be used as gate dielectric material 14 include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a dielectric metal oxide can be formed and used as the gate dielectric material 14.

In some embodiments of the present application, the gate dielectric material 14 can be formed by a deposition technique such as, for example, chemical vapor deposition (CVD), plasma enhanced chemical vapor deposition (PECVD), physical vapor deposition (PVD), sputtering, or atomic layer deposition. In another embodiment of the present application, the gate dielectric material 14 can be formed by a thermal growth technique such as, for example, thermal oxidation and/or thermal nitridation. In yet a further embodiment of the present application, a combination of a deposition and thermal growth may be used in forming a multilayered gate dielectric structure.

In one embodiment of the present application, the gate dielectric material 14 can have a thickness in a range from 1 nm to 10 nm. Other thicknesses that are lesser than or greater than the aforementioned thickness range can also be employed for the gate dielectric material 14.

The gate conductor 16 that can be used in the present application can be composed of doped polysilicon, doped silicon germanium, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), or multilayered combinations thereof. In one embodiment, an entirety of the gate conductor 16 is comprised of a doped polysilicon or doped polysilicon germanium. In another embodiment, a lower portion of the gate conductor 16 is comprised a conductive material other than doped polysilicon or doped polysilicon germanium, and an upper portion of the gate conductor 16 is comprised of doped polysilicon or doped silicon germanium.

The gate conductor 16 can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. In one embodiment, the gate conductor 16 has a thickness from 1 nm to 100 nm. Other thicknesses that are lesser than or greater than the aforementioned thickness range can also be employed for the gate conductor 16.

Figure 2:
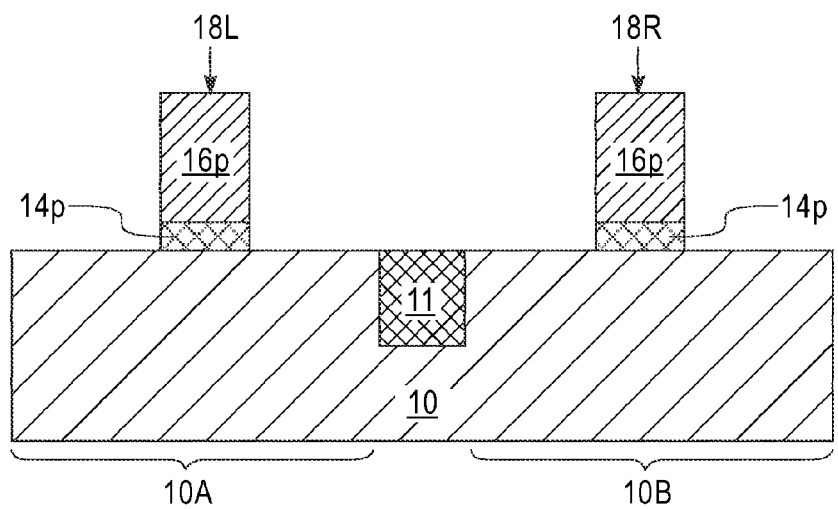
FIG. 2 is a cross sectional view of the first exemplary semiconductor structure of FIG. 1 after patterning the material stack into a first functional gate structure located within the first device region and a second functional gate structure within the second device region.

Referring now to FIG. 2, there is illustrated the first exemplary semiconductor structure of FIG. 1 after patterning the material stack 12 (including gate dielectric material 14 and gate conductor 16) into functional gate structures 18L, 18R. As is shown, a first functional gate structure 18L is present in the first device region 10A, while a second functional gate structure 18R is present in the second device region 10B. Each functional gate structure 18L, 18R includes, from bottom to top, a gate dielectric portion 14p and a gate conductor portion 16p. Gate dielectric portion 14p includes a remaining portion of the gate dielectric material 14 of material stack 12, while gate conductor portion 16p includes a remaining portion of the gate conductor 16 of material stack 12.

Although the above description illustrates the formation of functional gate structures 18L, 18R that are composed of a same material for the gate dielectric portions 14p and a same material for the gate conductor portions 16p, it also possible to form functional gate structures 18L, 18R in which the material of the gate dielectric portions 14p and/or the material of the gate conductor portions 16p of the functional gate structures 18L, 18R are different. In such instances, block mask technology can be used to form material stacks in the different device regions in which the material of the gate dielectric portions 14p and/or the material of the gate conductor portions 16p of the functional gate structures 18R, 18L are different.

The functional gate structures 18L, 18R can be formed by lithography and etching. Lithography can include forming a photoresist (not shown) on the topmost surface of gate conductor 16 exposing the photoresist to a desired pattern of radiation, and then developing the exposed photoresist with a resist developer to provide a patterned photoresist atop the gate conductor 16 of material stack 12. At least one etch is then employed which transfers the pattern from the patterned photoresist into the various materials of the material stack 12. In one embodiment, the etch used for pattern transfer may include a dry etch process such as, for example, reactive ion etching, plasma etching, ion beam etching or laser ablation. In another embodiment, the etch used for pattern transfer may include a wet chemical etchant such as, for example, KOH (potassium hydroxide). In yet another embodiment, a combination of a dry etch and a wet chemical etch may be used to transfer the pattern. After transferring the pattern into the material layers of material stack 12, the patterned photoresist can be removed utilizing a resist stripping process such as, for example, ashing.

As is shown in the embodiment illustrated in FIG. 2, the sidewall edges of each gate dielectric material portion 14p and each gate conductor portion 16p are vertically coincident to (i.e., vertically aligned with) each other.

Figure 3:
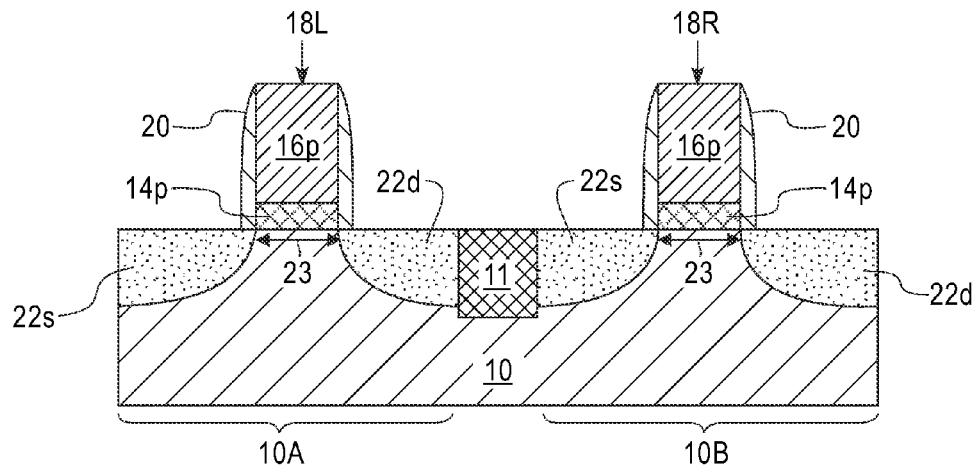
FIG. 3 is a cross sectional view of the first exemplary semiconductor structure of FIG. 2 after forming a spacer on sidewall surfaces of each functional gate structure and forming a source region in a Si-containing semiconductor material portion of the Si-containing semiconductor substrate on one side of the each functional gate structure and forming a drain region in another Si-containing semiconductor material portion of the Si-containing semiconductor substrate on another side of each functional gate structure.

Referring now to FIG. 3, there is illustrated the first exemplary semiconductor structure of FIG. 2 after forming a spacer 20 on sidewall surfaces of each functional gate structure 18L, 18R and forming a source region 22s in a Si-containing semiconductor material portion of the Si-containing semiconductor substrate 10 on one side of each functional gate structure 18L 18R and forming a drain region 22d in another Si-containing semiconductor material portion of the Si-containing semiconductor substrate 10 on another side of the each functional gate structure 18L, 18R. The Si-containing semiconductor portion of the semiconductor substrate 10 that is located beneath each functional gate structure 18L, 18R and positioned between the source region 22s and the drain region 22d is referred as a channel region 23.

The spacer 20 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 20 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

FIG. 3 also shows the presence of a source region 22s located within a Si-containing semiconductor material portion of the Si-containing semiconductor substrate 10 on one side of each functional gate structure 18L, 18R and a drain region 22d located within another Si-containing semiconductor material portion of the Si-containing semiconductor substrate 10 on another side of each functional gate structure 18L, 18R. In some embodiments, a source extension region and drain extension region (not separately shown) are typically formed prior to forming the spacer 20 utilizing an extension ion implantation process. As such, a portion of each of the source extension region and drain extension region would be located beneath the spacer 20. After forming the spacer 20, source region 22s and drain region 22d are formed utilizing a source/drain ion implantation process. An activation anneal may follow the implantation process.

Each source region 22s (including the corresponding source extension region) and each drain region 22d (including the corresponding drain extension region) may be doped with a p-type or n-type dopant. The term "p-type" refers to the addition of impurities to an intrinsic semiconductor that creates deficiencies of valence electrons. In a silicon-containing substrate, examples of p-type dopants, i.e., impurities, include, but are not limited to, boron, aluminum, gallium and indium. "N-type" refers to the addition of impurities that contributes free electrons to an intrinsic semiconductor. In a silicon-containing substrate examples of n-type dopants, i.e., impurities, include, but are not limited to, antimony, arsenic and phosphorous. The concentration of dopants within each source region 22s (and corresponding source extension region) and each drain region 22d (and the corresponding drain extension region) can be within ranges typically used in forming metal oxide semiconductor field effect transistors (MOSFETs). Since each source region 22s and each drain region 22d is located within a Si-containing semiconductor portion of the Si-containing substrate 10, each source region 22s and each drain region also includes a Si-containing semiconductor material that is doped.

Figure 4:
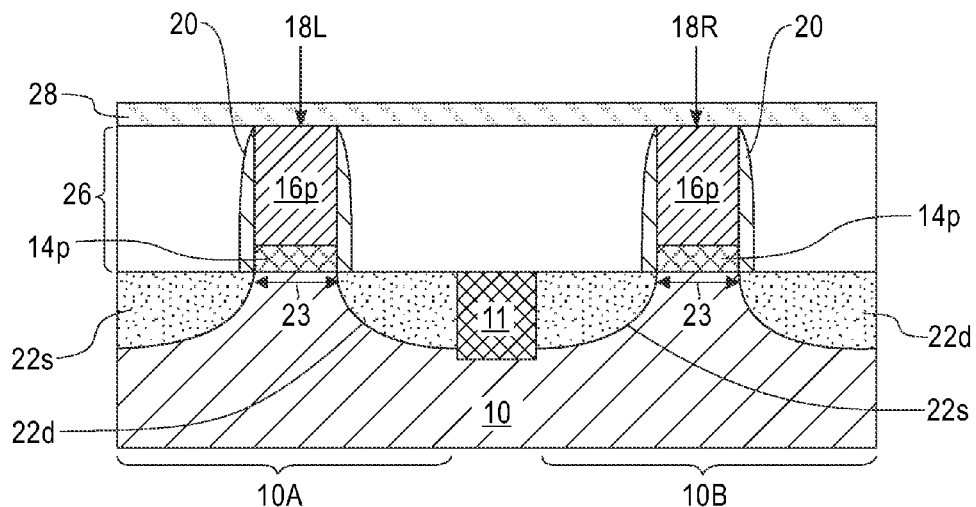
FIG. 4 is a cross sectional view of the first exemplary semiconductor structure of FIG. 3 after forming a dielectric material and thereafter a dielectric cap material.

Referring now to FIG. 4, there is illustrated the first exemplary semiconductor structure of FIG. 3 after forming a dielectric material 26 and thereafter a dielectric cap material 28. As is illustrated, the dielectric material 26 has an uppermost surface that is coplanar with an uppermost surface of each functional gate structure 18L, 18R. The dielectric material 26 has a bottommost surface that contacts an uppermost surface of each source region 24s, an uppermost surface of each drain region 24d, and an uppermost surface of each insulation structure 11. The uppermost surface of each functional gate structure 18L, 18R is exposed immediately after forming the dielectric material 26.

In some embodiments, the dielectric material 26 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 26. The use of a self-planarizing dielectric material as dielectric material 26 may avoid the need to perform a subsequent planarizing step.

In one embodiment, the dielectric material 26 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 26, a planarization process or an etch back process follows the deposition of the dielectric material. The thickness of the dielectric material 26 that can be employed in the present application may vary depending on the type of dielectric material employed as well as the method that was employed in forming the same. In one embodiment, the dielectric material 26 has a thickness from 80 nm to 500 nm. Other thicknesses that are greater or lesser than the range provided above can also be used for the dielectric material 26.

After forming dielectric material 26, a dielectric cap material 28 is formed on an uppermost surface of the dielectric material 26 as well as an uppermost surface of each functional gate structure 18L, 18R. The dielectric cap material 28 includes an insulator material that differs from the dielectric material 26. Examples of insulator materials that can be used as the dielectric cap material 28 include, for example, silicon dioxide, silicon nitride and silicon oxynitride. The dielectric cap material 28 can be formed by a deposition process including, for example, chemical vapor deposition, plasma enhanced chemical vapor deposition, evaporation and spin-on coating. The dielectric cap material 28 has a thickness from 1 nm to 20 nm. Other thicknesses can also be used for the thickness of the dielectric cap material 28.

Figure 5:
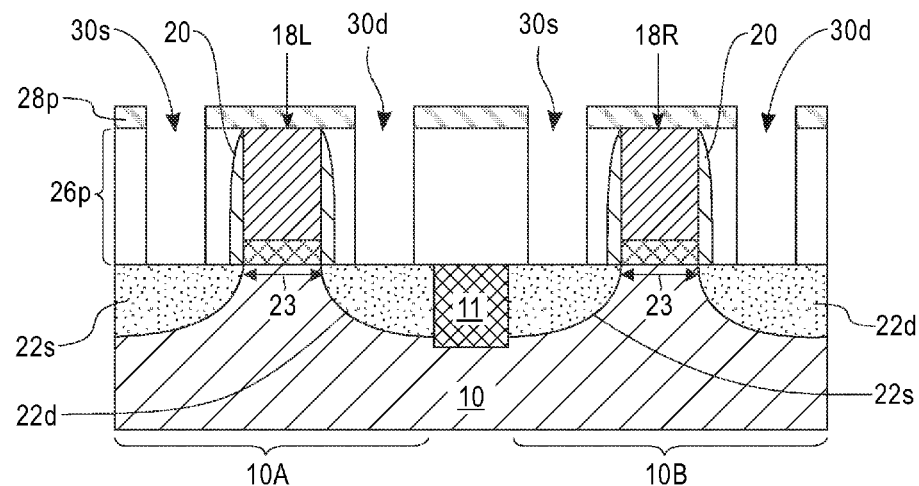
FIG. 5 is a cross sectional view of the first exemplary semiconductor structure of FIG. 4 after forming a plurality of contact openings through the dielectric cap material and the dielectric material to expose the source region and the drain region of the each functional gate structure.

Referring now to FIG. 5, there is illustrated the first exemplary semiconductor structure of FIG. 4 after forming a plurality of contact openings through the dielectric cap material 28 and the dielectric material 26 to expose each source region 22s and each drain region 22d of each functional gate structure 18L, 18R. Notably, contact openings 30s expose each source region 22s, while contact openings 30d expose each drain region 22d. The remaining portions of the dielectric material 26 may be referred to herein as dielectric material portions 26p and the remaining portions of the dielectric cap material 28 may be referred to herein as dielectric cap material portions 28p.

The plurality of openings 30s, 30d can be formed by lithography and etching. One or more etching processes can be used in forming the plurality of openings 30s, 30d. As is shown, a dielectric cap material portion 28p is present on a topmost surface of each functional gate structure 18L, 18R, and other dielectric cap material portions 28p are located on remaining portions of the dielectric material 26. As is shown in the drawings of the present application, the dielectric cap material portion 28p that is located on the topmost surface of each functional gate structure 18L, 18R extends beyond the edges of each functional gate structure 18L, 18R and beyond an outermost edge of each spacer 20. Also, a portion of each dielectric cap material portion 28p that is present on the topmost surface of each functional gate structure 18l, 18R is present on a dielectric material portion 26p that remains adjacent to the spacer 20. Further, the dielectric cap material portion 28p and the dielectric material portion 26p that are present above the isolation structure 11 extend beyond the outer most edges of the isolation structure 11.

In some embodiments of the present application, the plurality of openings 30s, 30d have a width, as measured from one exposed sidewall of a dielectric material portion 26p to another exposed sidewall of another dielectric material portion 26p, of from 10 nm to 50 nm. Other widths that are greater than or lesser than the aforementioned widths can also be used in the present application.

Figure 6:
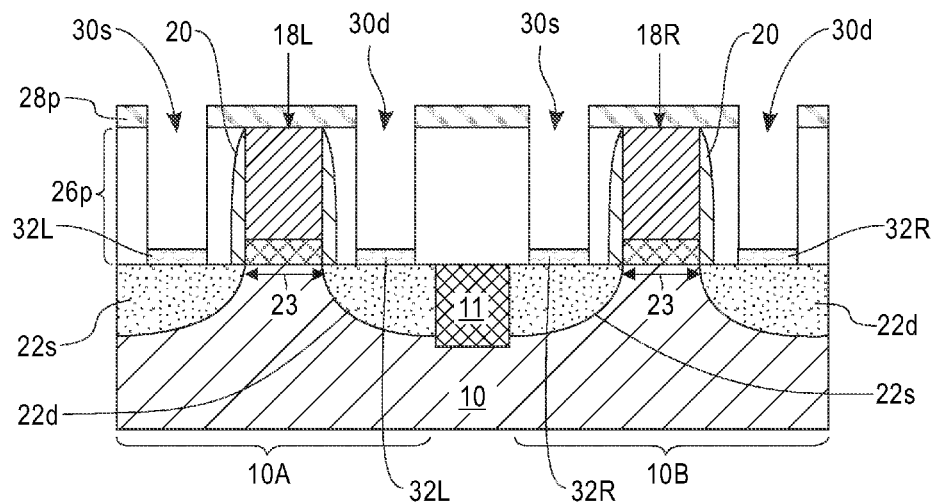
FIG. 6 is a cross sectional view of the first exemplary semiconductor structure of FIG. 5 after forming an interfacial oxide layer within each contact opening and on the exposed source region and the exposed drain region of each functional gate structure.

Referring now to FIG. 6, there is illustrated the first exemplary semiconductor structure of FIG. 5 after forming an interfacial oxide layer 32L, 32R within each contact opening 30s, 30d and on the exposed portions of each source region 22s and the exposed portions of each drain region 22d of each functional gate structure 18L, 18R. The interfacial oxide layer 32L, 32R that is formed can also be referred to as a chemical oxide layer. The interfacial oxide layer 32L, 32R is comprised of semiconductor oxide, a semiconductor oxynitride or a nitrided semiconductor oxide. For example, the interfacial oxide layer 32L, 32R can be comprised of silicon oxide, silicon oxynitride or nitride silicon oxide. The thickness of the interfacial oxide layer 32L, 32R is typically from 0.5 nm to 5 nm, with a thickness from 1.5 nm to 3.5 nm being more typical.

In one embodiment, the interfacial oxide layer 32L, 32R can be formed on the exposed portions of the source region 22s and the exposed portion of the drain region 22d utilizing a conventional growing technique that is well known to those skilled in the art including, for example, chemical oxidation, thermal oxidation or thermal oxynitridation. In another embodiment, the interfacial oxide layer 32L, 32R can be formed utilizing a wet chemical oxidation process. In one example, the wet chemical oxidation that can be used in providing the interfacial oxide layer includes treating the exposed surface portions of each source region 22s and each drain region 22d with a mixture of ammonium hydroxide, hydrogen peroxide and water (in a 1:1:5 ratio) at 65° C. In another example, the chemical oxidation can be implemented using a mixture of sulfuric acid, hydrogen peroxide and water.

Figure 7:
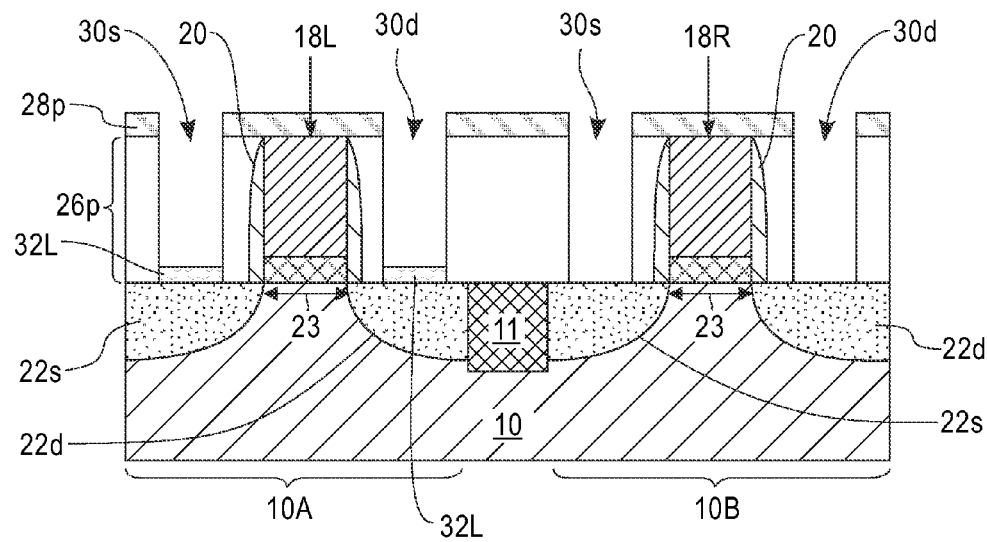
FIG. 7 is a cross sectional view of the first exemplary semiconductor structure of FIG. 6 after removing the interfacial oxide layer from the source region and the drain region within the second device region, while maintaining the interfacial oxide layer on the source region and the drain region within the first device region.

Referring now to FIG. 7, there is illustrated the first exemplary semiconductor structure of FIG. 6 after removing the interfacial oxide layer 32R from the source region 22s and the drain region 22d within the second device region 10B, while maintaining the interfacial oxide layer 32L on the source region 22s and the drain region 22d within the first device region 10A. In some embodiments of the present application, this step of the present application, i.e., the removal of the interfacial oxide layer completely from one of the device regions can be omitted. Typically, but not necessarily always, the interfacial oxide layer is removed from the device region in which pFET devices are to be formed.

In one embodiment of the present application, the selective removal of interfacial oxide layer from one of the device regions, but not the other can be achieved by first forming a block mask (not shown) on the device region in which the interfacial oxide layer is to be maintained. Next, a selective etching process is used to remove the interfacial oxide layer from atop the source region and drain region of the one device region in which the block mask is not present. The selective etching process may include a wet etch such as, for example, diluted fluoridric acid (dHF). Upon removal of the interfacial oxide layer from atop the source region and drain region of the one device region in which the block mask is not present, the source region and the drain region of the one device region not including the block mask are re-exposed. Following the removal of the interfacial oxide layer from atop the source region and drain region of the one device region in which the block mask is not present, the block mask can be removed by planarization and/or etching.

In some embodiments of the present application, the structure shown in FIG. 7 can be provided by forming a block mask (not shown) prior to formation of an interfacial oxide layer. In this embodiment, the block mask can be formed on the device region of the structure shown in FIG. 5 in which the interfacial oxide layer is to be omitted. With the block mask in place, the interfacial oxide layer is formed only in the device regions in which the block mask is not formed. After formation of the interfacial oxide layer, the block mask can be removed providing the structure shown, for example, in FIG. 7. In some embodiments the mask may remain and be used later in the process.

In another embodiment of the present application, the structure shown in FIG. 7 can also be formed by utilizing a Si-containing semiconductor substrate 10 in which the Si-containing semiconductor material in the first device region 10A has a different composition (SiGe vs Si) or dopant (As or P vs. B doped) as compared to the Si-containing material in the second device region 10B. This provides device regions in which the interfacial oxide can grow faster in one of the device regions than the other device region. For example, the Si-containing material in the first device region 10A may be composed of a boron doped silicon germanium alloy, while the Si-containing material in the second device region 10B may be composed of arsenic, phosphorous doped silicon or Si(C). In such an example, an interfacial oxide layer grows faster and thus thicker on n-doped silicon than on p-doped silicon germanium alloy. Depending on the conditions of the interfacial oxide formation, a negligible amount of, interfacial oxide can be formed in the device region including the silicon germanium alloy. Here the rate of oxide formation leads to two different oxide thickness and allows for the two different silicide configuration on different devices.

In another embodiment, the different oxide thicknesses are achieved using the differences in oxide etch rates on n- or p-doped substrates. If both n and p regions are oxide covered, a standard DHF will remove the oxide on highly n-doped substrates but it will be very difficult to fully remove the oxide on highly p-doped substrates. The last few layers of oxide on a highly doped pFET region are extremely difficult to remove (well known in the industry, a bright light, typically UV light is required to remove oxide on highly p-doped wafers . . . the light generates the necessary carriers for the etch to proceed). As a result, the interfacial oxide that is formed on in the device region that includes the n-doped substrate may be removed utilizing a selective etching process, while still maintaining the interfacial oxide layer in the device region that includes the p-doped silicon or p-doped silicon germanium alloy.

Figure 8:
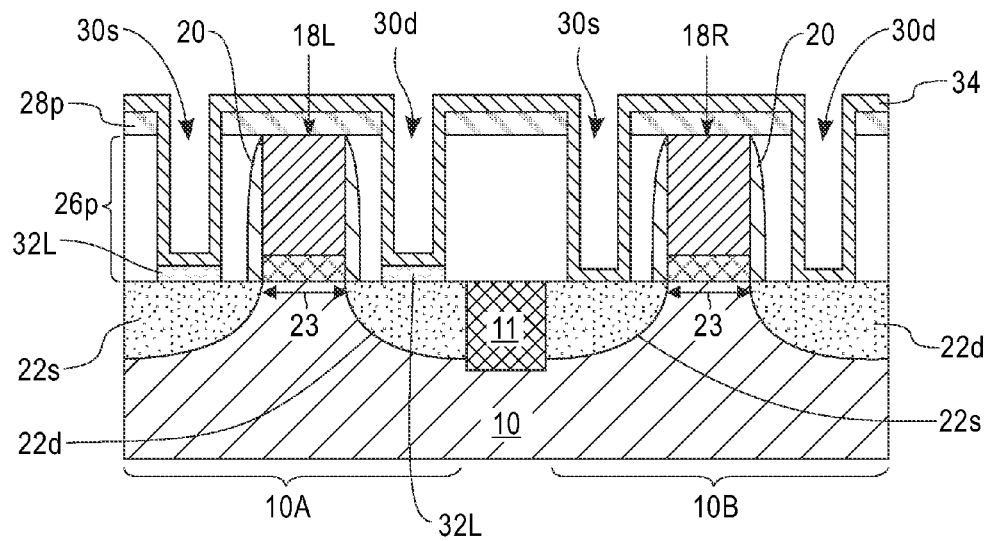
FIG. 8 is a cross sectional view of the first exemplary semiconductor structure of FIG. 7 after forming a NiPt alloy layer on an uppermost surface of the dielectric cap material and within each contact opening.

Referring now to FIG. 8, there is illustrated the first exemplary semiconductor structure of FIG. 7 after forming a NiPt alloy layer 34 on an uppermost surface of the dielectric cap material portions 28p and within each contact opening 30s, 30d. Within contact openings 30s, 30d in the first device region 10A, the NiPt alloy layer 34 has a bottom surface along a horizontal portion that is in direct contact with a top surface of the interfacial oxide layer 32L. Within contact openings 30s, 30d and in the second device region 10B, the NiPt alloy 34 has a bottom surface along a horizontal portion that is in direct contact with the re-exposed top surface of the source region 22s and the drain region 22d.

The NiPt alloy layer 34 can be formed by a deposition process including, for example, chemical vapor deposition, plasma enhanced chemical vapor deposition, plating or sputtering. In some embodiments, the NiPt alloy layer 34 can be formed utilizing a co-deposition process such as, for example, co-sputtering.

The NiPt alloy layer 34 that is formed in the present application is a contiguous layer and has an as deposited thickness of from 1 nm to 10 nm. The thickness of the NiPt alloy layer 34 may be lesser than or greater than the range mentioned herein. The NiPt alloy may comprise 50 atomic percent to 100 atomic percent Ni and the remainder being Pt.

Figure 9:
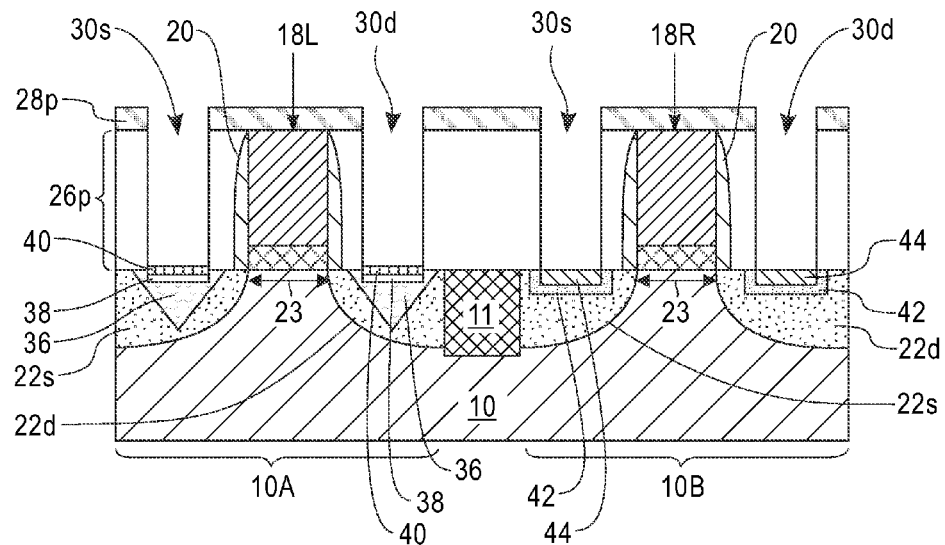
FIG. 9 is a cross sectional view of the first exemplary semiconductor structure of FIG. 8 after annealing and removing any non-reactive portion of the NiPt alloy layer from the structure.

Referring now to FIG. 9, there is illustrated the first exemplary semiconductor structure of FIG. 8 after annealing and removing any non-reactive portion of the NiPt alloy layer 34 from the structure.

In the device region in which the interfacial oxide layer was not removed, the anneal forms a first contact structure of, from bottom to top, a nickel disilicide alloy body 36 having an inverted pyramidal shape, a Pt rich silicide cap region 38 and an oxygen rich region 40. It is noted that in the device region in which the interfacial oxide layer was not removed, the anneal forms a first contact structure in which no Pt is present at the interface within the Si-containing material of the source and drain regions. The term "inverted pyramid" denotes that the nickel disilicide alloy body 36 of the first contact structure has a triangular shape including a base portion that is located above a tip portion; the base portion and the tip portion are connected to each other by sidewall portions.

In the device region in which the interfacial oxide layer was previously removed, the anneal forms a second contact structure that includes a nickel monosilicide alloy body 44 in which a Pt region 42 is present at the interface between the nickel monosilicide alloy body 44 and the Si-containing material of the source and drain regions. In some embodiments of the present application, the second contact structure is not formed, and only the first contact structure is formed in both device regions.

It is noted that the nickel disilicide alloy that is formed in the first contact structure is the most stable phase of a nickel silicide alloy that can formed and thus no volume changes occurs to the nickel disilicide alloy body 34.

The first contact structure includes a source-side contact structure and a drain contact structure, while the second contact structure includes a source-side contact structure and a drain contact structure. As is shown in the drawing, the Pt rich silicide cap region 38 that is formed is entirely embedded within the nickel disilicide alloy body 34, while the oxygen rich region 40 that is formed includes a lower portion that is embedded within the nickel disilicide alloy body 34 and an upper portion that is located above the nickel disilicide alloy body 34.

The anneal that is used in forming the first contact structure and the optional second contact structure can be performed at a temperature from 300° C. to 900° C. in an inert ambient such as for example, helium, argon and mixtures thereof. The anneal causes upward diffusion of Si atoms and downward diffusion of Ni atoms which diffused atoms that react forming an appropriate phase of a nickel silicide alloy. Other anneal temperatures can be selected as long as the anneal temperature selected is capable of forming at least the first contact structure. The anneal may include a rapid thermal anneal, a furnace anneal, a laser anneal or a microwave anneal. Rapid thermal anneals are typically preformed for a shorter duration of time than furnace anneals. When a rapid thermal anneal is used, the duration of the anneal at the peak temperature is typically from 1 sec to 30 sec. When a furnace anneal is used, the duration of the anneal is typically from 30 mins to 4 hours. When a laser anneal is used, the duration of the anneal is typically from 0.1 millisecond to 1 millisecond.

As mentioned above, any unreactive portion of the NiPt alloy layer 34 can be removed after anneal utilizing a selective etch process. In one example, a mixture of nitric acid, chloridric acid and water (so called aqua region chemistry) etch may be used in removing any unreactive portion of the NiPt alloy layer 34.

Figure 10:
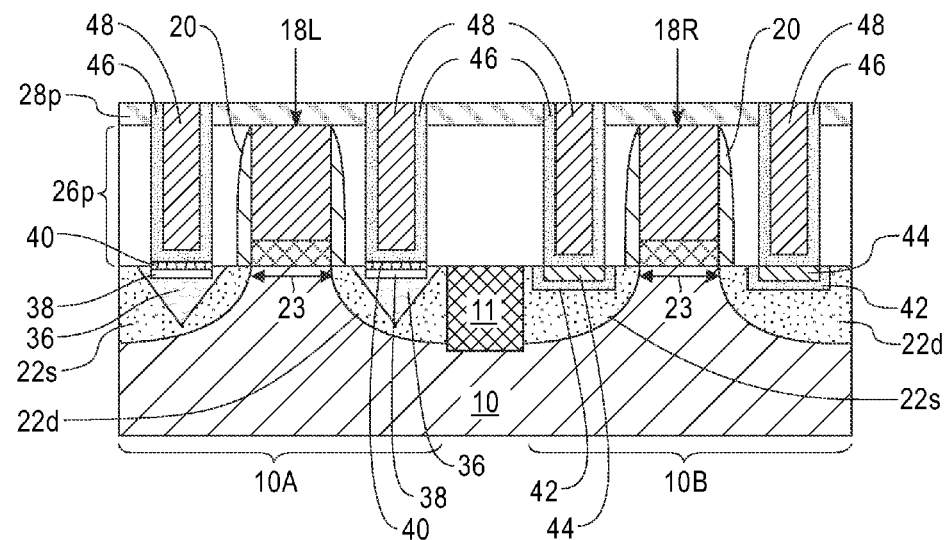
FIG. 10 is a cross sectional view of the first exemplary semiconductor structure of FIG. 9 after filling remaining portions of each contact opening with a diffusion barrier and a contact metal and performing a planarization process.

Referring now to FIG. 10, there is illustrated the first exemplary semiconductor structure of FIG. 9 after filling remaining portions of each contact opening 30s, 30d with a diffusion barrier and a contact metal and performing a planarization process.

The diffusion barrier may comprise a material or combination of materials that prevent a conductive material from diffusion therethrough. Examples of materials that can be used as diffusion barrier include, but are not limited to, tantalum (Ta), tantalum nitride (TaN), titanium (Ti), titanium nitride (TiN), ruthenium (Ru), ruthenium nitride (RuN), ruthenium tantalum nitride (RuTaN), W (tungsten), tungsten nitride (WN) and any combination thereof, i.e., Ti/TiN. The diffusion barrier can be formed by a deposition process such as, for example, chemical vapor deposition (CVD), plasma enhanced chemical vapor deposition (CVD), atomic layer deposition (ALD), physical vapor deposition (PVD), sputtering, chemical solution deposition, and plating. The diffusion barrier that is deposited may have a thickness from 2 nm to 50 nm. Other thicknesses that are greater than or lesser than the aforementioned thickness range can also be used for the thickness of the diffusion barrier.

The contact metal includes a conductive material other than nickel, Ni, or platinum, Pt, and other than the material or materials used as the diffusion barrier. Exemplary contact metals that can be used in the present application include at least one of copper (C), tungsten (W), aluminum (Al) and alloys thereof such as, for example, a copper-aluminum alloy. In one embodiment, the contact metal that fills each contact opening 30s, 30d comprises copper or a copper alloy such as, for example, a copper-aluminum alloy. The conductive material used in providing the contact metal may be formed by a deposition process including chemical vapor deposition (CVD), plasma enhanced chemical vapor deposition (PECVD), sputtering, or chemical solution deposition. Alternatively, a plating process that fills each contact opening 30s, 30d from the bottom upwards can be used.

After depositing the conductive material used in providing the metal contact, a planarization process such as, for example, chemical mechanical polishing (CMP) and/or grinding, can be employed to remove portions of the conductive metal and the diffusion barrier that extends outside and above the mouth of each contact opening 30s, 30d. In some embodiments, the planarization step can stop on an uppermost surface of each dielectric cap material portion 28p. In another embodiment, the planarization step can remove each dielectric cap material portion 28p from the structure. The remaining portion of the diffusion barrier material is labeled as element 46, while the remaining portion of the contact metal is labeled as element 48. As is shown, and after planarization, an uppermost surface of the contact metal 48 is coplanar with an uppermost surface of the diffusion barrier 46 which in turn are coplanar with either an uppermost surface of each dielectric cap material portion 28p or each dielectric material portion 26p.

Figure 11:
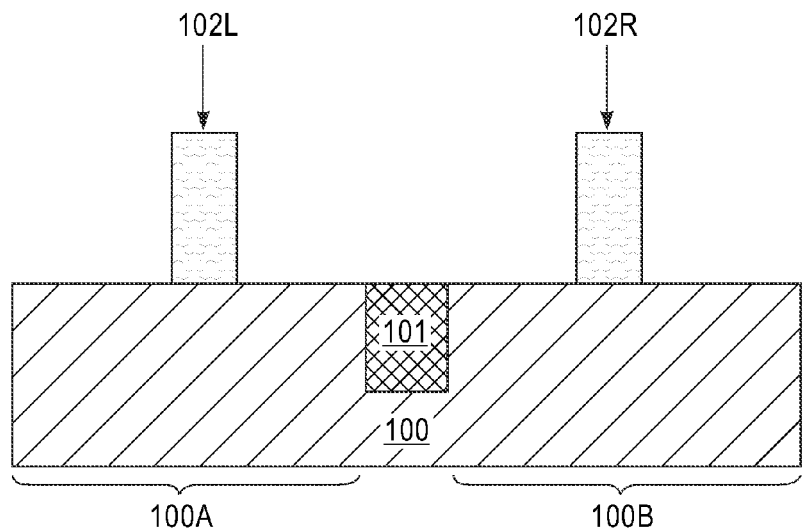
FIG. 11 is a cross sectional view of a second exemplary semiconductor structure including a first sacrificial gate structure formed on a first portion of an uppermost surface of a Si-containing semiconductor substrate and within a first device region and a second sacrificial gate structure formed on a second portion of the uppermost surface of the Si-containing semiconductor substrate and within a second device region in accordance with another embodiment of the present application.

Referring now to FIG. 11, there is illustrated a second exemplary semiconductor structure including sacrificial gate structures 102L, 102R formed on an uppermost surface of a Si-containing semiconductor substrate 100 in accordance with another embodiment of the present application. The Si-containing semiconductor substrate 100 used in providing the second exemplary semiconductor structure shown in FIG. 10 is the same as Si-containing semiconductor substrate 10 used in providing the first exemplary semiconductor structure shown in FIG. 1. Si-containing semiconductor substrate 100 may also be processed to include an isolation structure 101. Isolation structure 101 can be formed and include materials as described above in forming isolation structure 11 within Si-containing semiconductor substrate 10. The isolation structure 101 spaces apart a first device region 100A from a second device region 100B.

The sacrificial gate structures 102L, 102R are formed on an uppermost surface of Si-containing semiconductor substrate 100. The term "sacrificial gate structure" is used throughout the present application to denote a material that serves as a placeholder structure for a functional gate structure to be subsequently formed. Each sacrificial gate structure 102L, 102R can be formed by first providing a blanket layer of a sacrificial gate material on an uppermost surface of the Si-containing semiconductor substrate 100. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form each sacrificial gate structure 102L, 102R.

Figure 12:
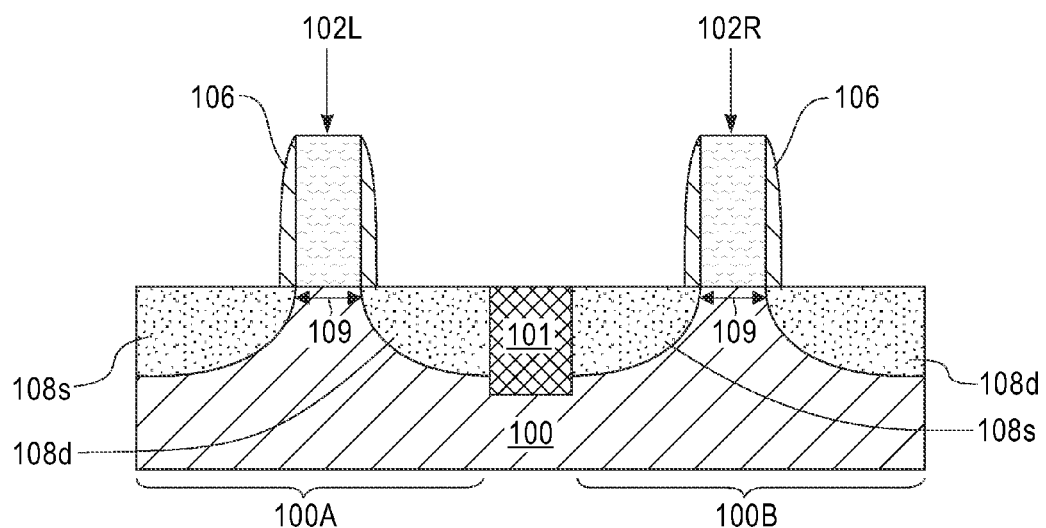
FIG. 12 is a cross sectional view of the second exemplary semiconductor structure of FIG. 11 after forming a spacer on sidewall surfaces of each sacrificial gate structure and forming a source region on one side of each sacrificial gate structure and a drain region on another side of each sacrificial gate structure.

Referring now to FIG. 12, there is illustrated the second exemplary semiconductor structure of FIG. 11 after forming a spacer 106 on each sidewall of each sacrificial gate structure 102L, 102R and forming a source region 108s on one side of each sacrificial gate structure 102L, 102R and a drain region 108d on another side of each sacrificial gate structure 102L, 102R. The Si-containing semiconductor portion of the Si-containing semiconductor substrate 100 that is positioned between the source region 108s and the drain region 108d is referred as a channel region 109.

The spacer 106 comprises one of the spacer materials mentioned above in forming spacer 20. Spacer 106 can also be formed utilizing the technique mentioned above in forming spacer 20. The source region 108s and the drain region 108d can be formed by ion implantation as was also mentioned above in forming the source region 22s and the drain region 22d in the first exemplary semiconductor structure.

Figure 13:
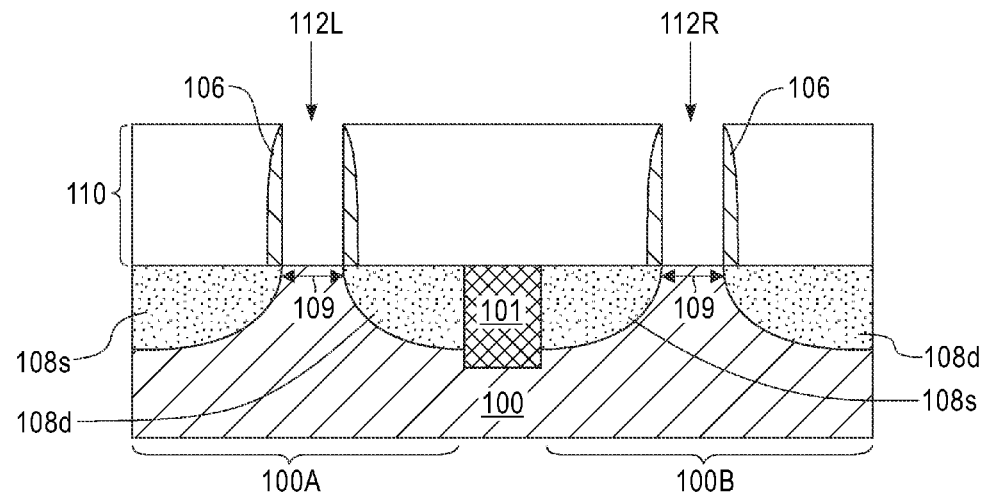
FIG. 13 is a cross sectional view of the second exemplary semiconductor structure of FIG. 12 after forming a dielectric material and thereafter forming a gate cavity by removing each sacrificial gate structure.

Referring now to FIG. 13, there is illustrated the second exemplary semiconductor structure of FIG. 12 after forming a dielectric material 110 and thereafter forming gate cavities 112L, 112R by removing each sacrificial gate structure 102L, 102R. Prior to forming the gate cavities, the dielectric material 110 has an uppermost surface that is coplanar with an uppermost surface of each sacrificial gate structure 102L, 102R. As such, the uppermost surface of each sacrificial gate structure 102L, 102R is exposed after forming the dielectric material 110.

The dielectric material 110 that is used in this embodiment of the present application may include one of the dielectric materials mentioned above for dielectric material 26. Also, dielectric material 110 may be formed utilizing one of the techniques mentioned above in forming dielectric material 26. The dielectric material 110 may have a thickness within the range mentioned above for dielectric material 26.

Each gate cavity 112L, 112R can be formed by removing each sacrificial gate material structures 102L, 102R from the structure. Each sacrificial gate material structure 102L, 102R can be removed by etching. In one example, a reactive ion etch can be used to removal each sacrificial gate material structure 102L, 102R.

Figure 14:
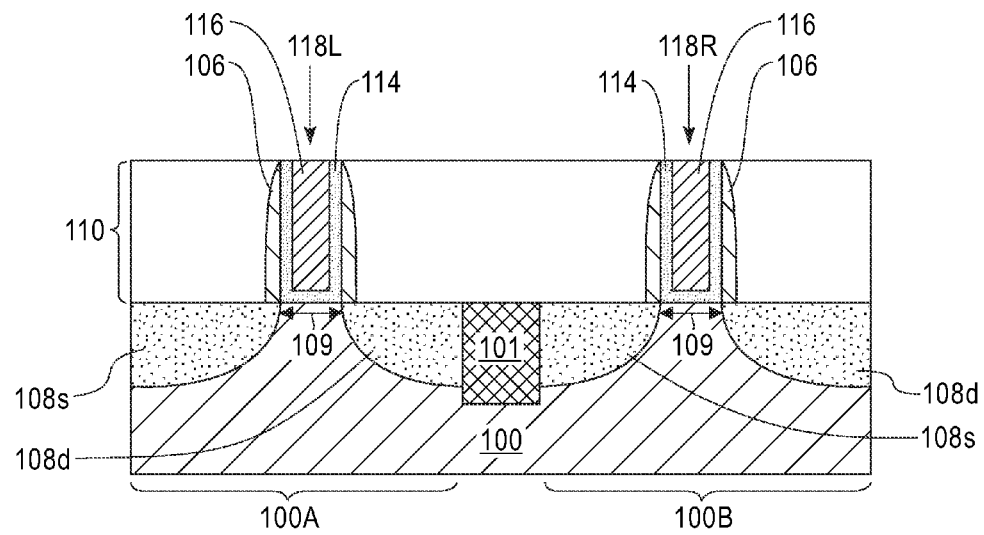
FIG. 14 is a cross sectional view of the second exemplary semiconductor structure of FIG. 13 after forming a gate dielectric portion and a gate conductor portion within the gate cavity.

Referring now to FIG. 14, there is illustrated the second exemplary semiconductor structure of FIG. 13 after forming a gate dielectric portion 114 and a gate conductor portion 116 within each gate cavity 112L, 112R. The gate dielectric portion 114 and the gate conductor portion 116 provide a functional gate structure 118L, 118R within the area previously occupied by the each sacrificial gate structure 102L, 102R.

In some embodiments and as shown in the drawing, the gate dielectric portion 114 is U-shaped having a bottommost portion in direct contact with an uppermost surface of the semiconductor substrate 100 and vertical portions that are located on exposed sidewalls of each spacer 106. Within each gate cavity 112L, 112R, the gate dielectric portion 114 surrounds the gate conductor portion 116. In another embodiment, the gate dielectric portion 114 is not U-shaped and thus lacks the vertical portions mentioned. In such an embodiment, the gate conductor portion 116 that is formed atop the non-U-shaped gate dielectric fills the remaining portion of the gate cavity and has outermost edges that directly contact a sidewall surface of each spacer 106.

The gate dielectric portion 114 may comprise one of the gate dielectric materials mentioned above for gate dielectric material 14. Also, the gate dielectric portion 114 may be formed utilizing one of the deposition techniques or thermal growth techniques mentioned above in forming gate dielectric 14. The thickness of gate dielectric portion 64 is also with the range mentioned above for gate dielectric material 14.

The gate conductor portion 116 may comprise one of the metal gate conductor materials mentioned above for gate conductor 16. Also, the gate dielectric portion 116 may be formed utilizing one of the deposition techniques mentioned above in forming gate conductor 16. The thickness of gate dielectric portion 116 is also with the range mentioned above for gate conductor 16.

Figure 15:
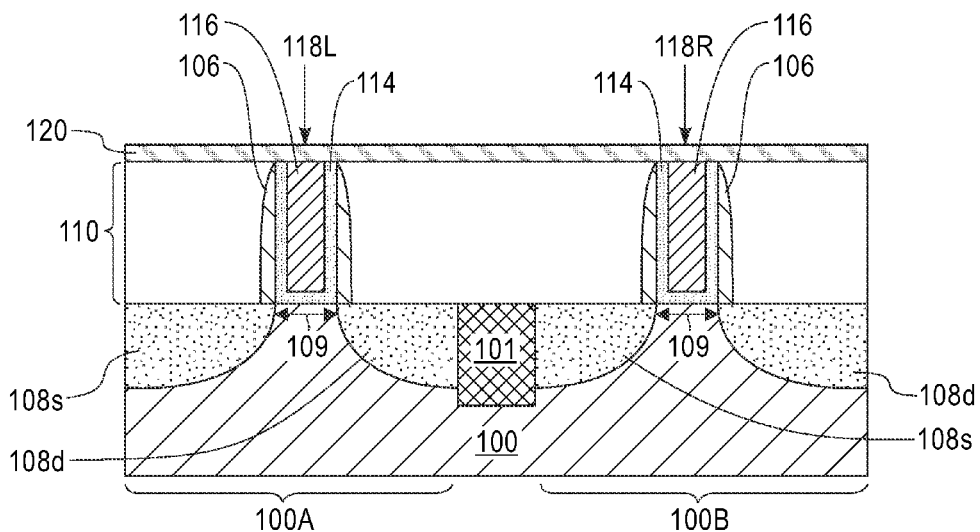
FIG. 15 is a cross sectional view of the second exemplary semiconductor structure of FIG. 14 after forming a dielectric cap material on an uppermost surface of the dielectric material.

Referring now to FIG. 15, there is illustrated the second exemplary semiconductor structure of FIG. 14 after forming a dielectric cap material 120 on an uppermost surface of the dielectric material 110. The dielectric cap material 120 includes one of the insulator materials mentioned above for dielectric cap material 28. The dielectric cap material 120 can be formed utilizing one of the techniques mentioned above in forming dielectric cap material 28. Also, the dielectric cap material 120 used in this embodiment of the present application can have a thickness within the range mentioned above for dielectric cap material 28.

Figure 16:
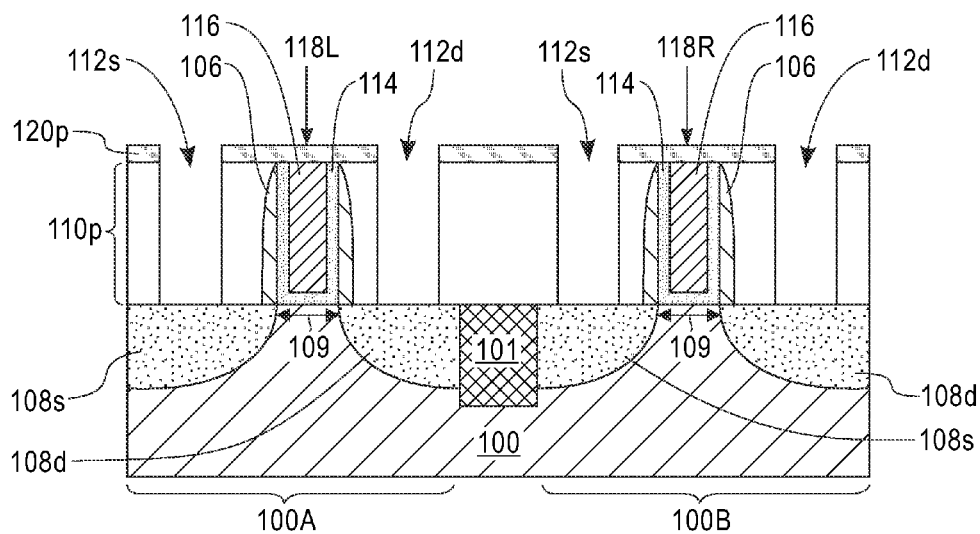
FIG. 16 is a cross sectional view of the second exemplary semiconductor structure of FIG. 15 after forming a plurality of contact openings through the dielectric cap material and the dielectric material exposing each source region and each drain region.

Referring now to FIG. 16, there is illustrated the second exemplary semiconductor structure of FIG. 15 after forming a plurality of openings 122s, 122d through the dielectric cap material 120 and the dielectric material 110 exposing each source region 108s and each drain region 108d. Each remaining portion of the dielectric cap material 120 is referred to herein as dielectric cap material portion 120p, while each remaining portion of the dielectric material 110 can be referred to herein as dielectric material portion 110p. The plurality of openings 122s, 122d can be formed by lithography and etching. One or more etching processes can be used in forming the plurality of openings 122s, 122d. A remaining portion of the dielectric cap material portion 120p is present on a topmost surface of each functional gate structure 118L, 118R. As is shown in the drawings of the present application, the dielectric cap material portion 120p that is located on the topmost surface of each functional gate structure 118L, 118R extends beyond the edges of each functional gate structure 118L, 118R and beyond an outermost edge of each spacer 106. Also, a portion of each dielectric cap material portion 120p that is present on the topmost surface of each functional gate structure 118L, 118R is present on a dielectric material portion 110p that remains adjacent to the spacer 106. Further, the dielectric cap material portion 120p and the dielectric material portion 110p that is present above the isolation regions 101 extend beyond the outer most edges of the isolation regions 101.

Figure 17:
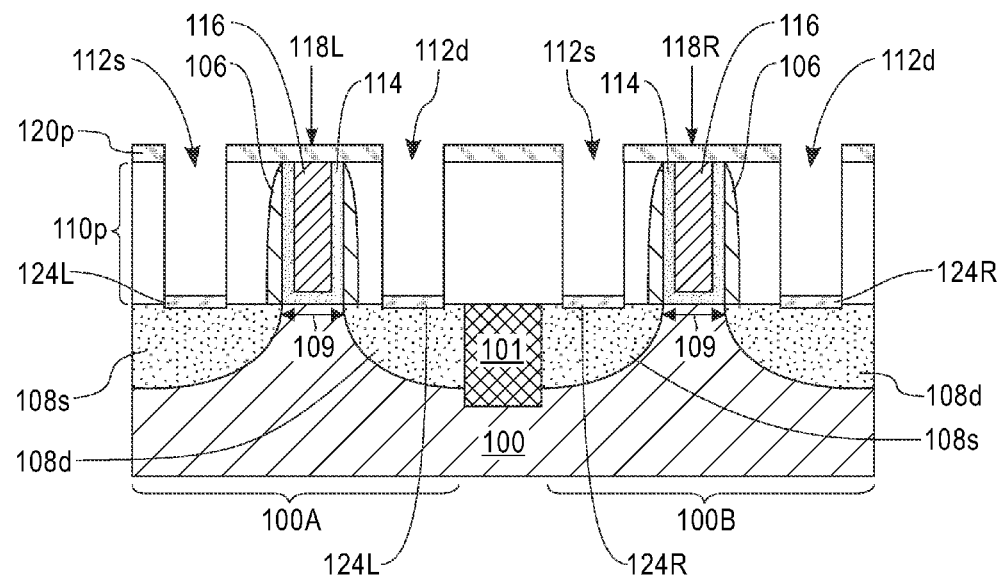
FIG. 17 is a cross sectional view of the second exemplary semiconductor structure of FIG. 16 after forming an interfacial oxide layer within each contact opening and on the exposed source region and the exposed drain region of each functional gate structure.

Referring now to FIG. 17, there is illustrated the second exemplary semiconductor structure of FIG. 16 after forming an interfacial oxide layer 124L, 124R within each contact opening 122s, 122d and on exposed surface portions of each source region 108s and exposed surface portions of each drain region 108d of each functional gate structure 118L, 118R. The interfacial oxide layer 124L, 124R used in this embodiment of the present application is the same as the interfacial oxide layer 32L, 32R used in the aforementioned embodiment of the present application. As such, the description concerning interfacial oxide layer 32L, 32R (including composition, thickness, and deposition processes) apply equal well here in describing interfacial oxide layer 124L, 124R.

Figure 18:
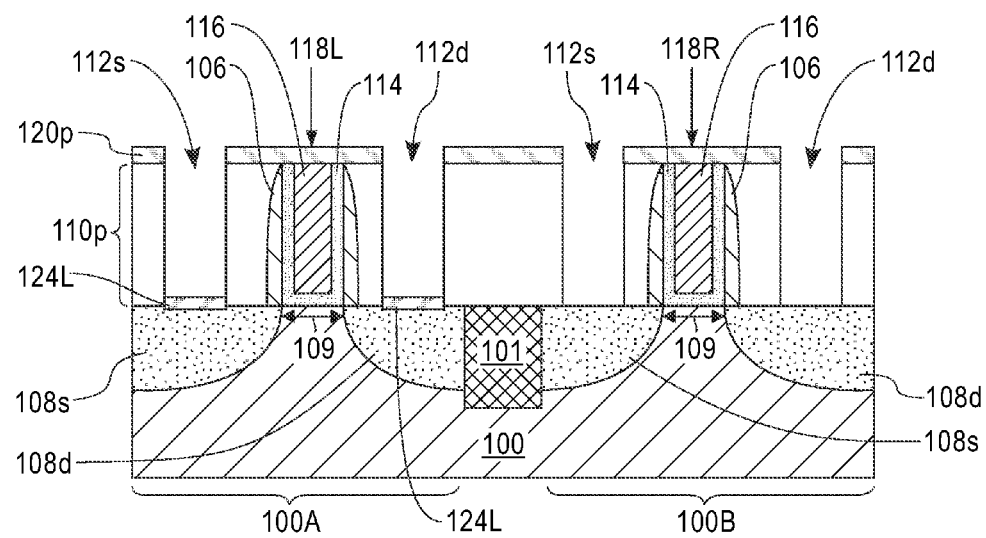
FIG. 18 is a cross sectional view of the second exemplary semiconductor structure of FIG. 17 after removing the interfacial oxide layer from the source region and the drain region within the second device region, while maintaining the interfacial oxide layer on the source region and the drain region within the first device region.

Referring now to FIG. 18, there is illustrated the second exemplary semiconductor structure of FIG. 17 after removing the interfacial oxide layer 124R from the source region 108s and the drain region 108d within the second device region 100B, while maintaining the interfacial oxide layer 124L on the source region 108s and the drain region 108d within the first device region 100A. The removal of the interfacial oxide layer from one of the device regions is optional and not need be performed in each and every instance. In the illustrated embodiment, the removal of the interfacial oxide layer 124R from the second device region 100B can be performed utilizing the technique as mentioned in the previous embodiment of the present application in which the interfacial oxide layer 32R was selectively removed from the second device region 10B. It is noted that the structure shown in FIG. 18 can be formed utilizing alternative methods as described above for forming the structure shown in FIG. 7.

Figure 19:
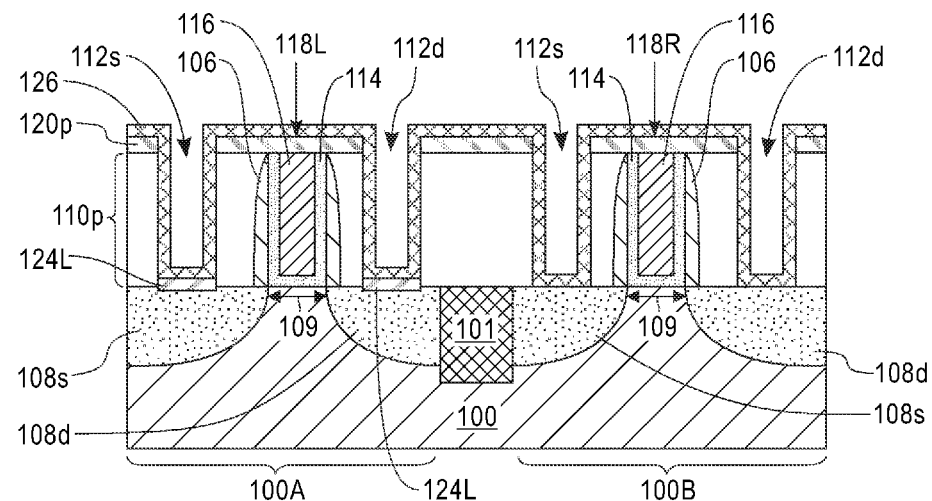
FIG. 19 is a cross sectional view of the second exemplary semiconductor structure of FIG. 18 after forming a NiPt alloy layer on an uppermost surface of the dielectric cap material and within each contact opening.

Referring now to FIG. 19, there is illustrated the second exemplary semiconductor structure of FIG. 18 after forming a NiPt alloy layer 126 on an uppermost surface of the dielectric cap material portions 120p and within each contact opening 122s, 122d. The NiPt alloy 126 used in this embodiment of the present application is the same as the NiPt alloy layer 34 used in the aforementioned embodiment of the present application. As such, the description concerning NiPt alloy layer 34 (including composition, thickness, and deposition processes) apply equal well here in describing NiPt alloy layer 126.

Within contact openings 122s, 122d in the first device region 100A, the NiPt alloy layer 126 has a bottom surface along a horizontal portion that is in direct contact with a top surface of the interfacial oxide layer 124L. Within contact openings 122s, 122d and in the second device region 100B, the NiPt alloy 126 has a bottom surface along a horizontal portion that is in direct contact with the re-exposed top surface of the source region 108s and the drain region 108d.

Figure 20:
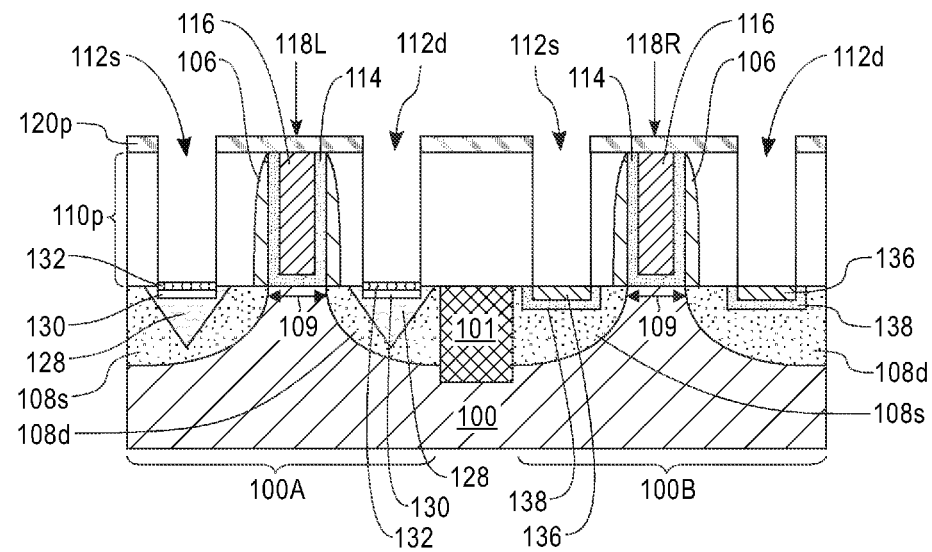
FIG. 20 is a cross sectional view of the second exemplary semiconductor structure of FIG. 19 after annealing and removing any non-reactive portion of the NiPt alloy layer from the structure.

Referring now to FIG. 20, there is illustrated the second exemplary semiconductor structure of FIG. 19 after annealing and removing any non-reactive portion of the NiPt alloy layer 126 from the structure. The anneal and removal of any non-reactive portion of the NiPt alloy layer used in this embodiment of the present application is the same as described above in the previous embodiment of the present application.

In the device region in which the interfacial oxide layer was not removed, the anneal forms a first contact structure of, from bottom to top, a nickel disilicide alloy body 128 having an inverted pyramidal shape, a Pt rich silicide cap region 130 and an oxygen rich region 132. It is noted that in the device region in which the interfacial oxide layer was not removed, the anneal forms a first contact structure in which no Pt is present at the interface within the Si-containing material of the source and drain regions. The term "inverted pyramid" denotes that the nickel disilicide alloy body 128 of the first contact structure has a triangular shape including a base portion 128b that is located above a tip portion; the base portion and the tip portion are connected to each other by sidewall portions.

In the device region in which the interfacial oxide layer was previously removed, the anneal forms a second contact structure that includes a nickel monosilicide alloy body 136 in which a Pt region 134 is present at the interface between the nickel monosilicide alloy body 136 and the Si-containing material of the source and drain regions. In some embodiments of the present application, the second contact structure is not formed, and only the first contact structure is formed in both device regions.

It is noted that the nickel disilicide alloy that is formed in the first contact structure is the most stable phase of a nickel silicide alloy that can formed and thus no volume changes occurs to the nickel disilicide alloy body 128. As is shown in the drawing, the Pt rich silicide cap region 130 that is formed is entirely embedded within the nickel disilicide alloy body 128, while the oxygen rich region 132 that is formed includes a lower portion that is embedded within the nickel disilicide alloy body 128 and an upper portion that is located above the nickel disilicide alloy body 128.

The first contact structure includes a source-side contact structure and a drain contact structure, while the second contact structure includes a source-side contact structure and a drain contact structure.

Figure 21:
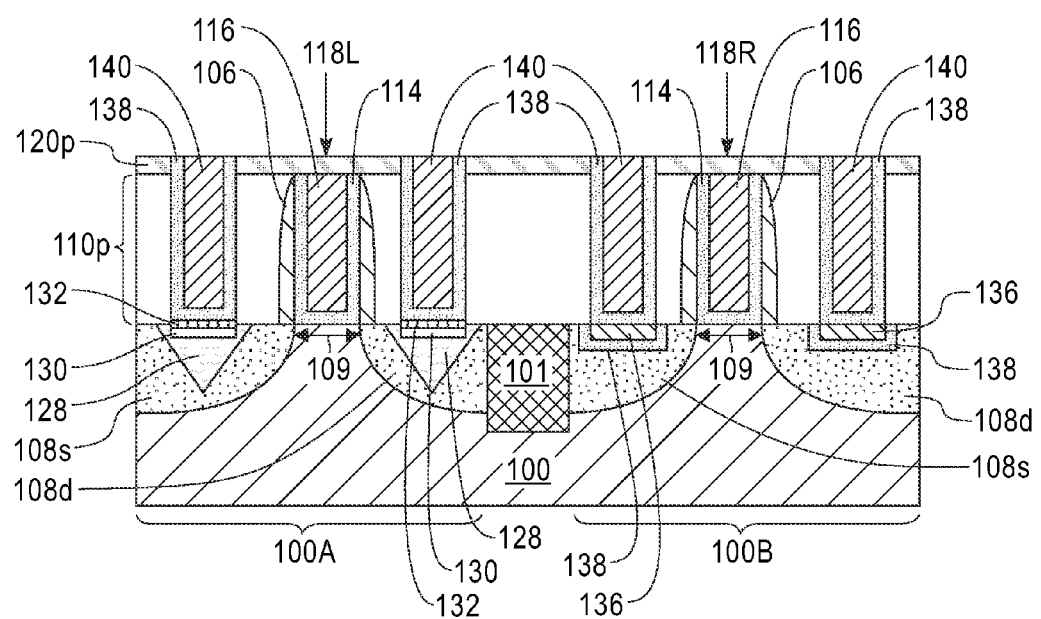
FIG. 21 is a cross sectional view of the second exemplary semiconductor structure of FIG. 20 after filling remaining portions of each contact opening with a diffusion barrier and a contact metal and performing a planarization process.

FIG. 21 is a cross sectional view of the first exemplary semiconductor structure of FIG. 20 after filling remaining portions of each contact opening with a diffusion barrier and a contact metal and performing a planarization process.

The diffusion barrier employed in this embodiment of the present application may comprise one of the diffusion barrier materials mentioned in the previous embodiment of the present application. The diffusion barrier of this embodiment of the present application can have a thickness as mentioned in the previous embodiment of the present application and one of the deposition techniques mentioned above in forming the diffusion barrier in the previous embodiment of the present application can also be used here in this embodiment.

The contact metal employed in this embodiment of the present application may comprise one of the conductive materials mentioned for forming the contact metal in the previous embodiment of the present application. The contact metal of this embodiment of the present application can be formed utilizing one of the deposition techniques mentioned above in forming the contact metal in the previous embodiment of the present application.

After depositing the conductive material used in providing the metal contact, a planarization process such as, for example, chemical mechanical polishing (CMP) and/or grinding, can be employed to remove portions of the conductive metal and the diffusion barrier that extends outside and above the mouth of each contact opening 122s, 122d. In some embodiments, the planarization step can stop on an uppermost surface of each dielectric cap material portion 122p. In another embodiment, the planarization step can remove each dielectric cap material portion 122p from the structure. The remaining portion of the diffusion barrier material is labeled as element 138, while the remaining portion of the contact metal is labeled as element 140. As is shown, and after planarization, an uppermost surface of the contact metal 140 is coplanar with an uppermost surface of the diffusion barrier 138 which in turn are coplanar with either an uppermost surface of each dielectric cap material portion 12p or each dielectric material portion 110p.

The method of the present application that is used in forming the first contact structure including the nickel disilicide alloy body having an inverted pyramid shape is not limited to the specific examples mentioned above. Instead, the method of the present application can be used in any other processing schemes including, for example, formation of FinFET and semiconductor nanowire devices. In addition, the method of the present application can be used in forming contact structures to any other type of semiconductor device such as, for example, a hetero-bipolar junction transistor (HBT).

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A semiconductor structure comprising:
a substrate having a source region and a drain region located within a Si-containing semiconductor material portion of a device region of said substrate, wherein said source region and said drain region are spaced apart by a channel region;
a functional gate structure located above said channel region;
a dielectric material located on each side of said functional gate structure;
contact openings located in said dielectric material and extending to said source region and said drain region;
a source-side contact structure located within one of said contact openings and in contact with said source region; and
a drain-side contact structure located within another of said contact openings and in contact with said drain region, wherein said source-side contact structure and said drain-side contact structure each comprises, from bottom to top, a nickel disilicide alloy body having an inverted pyramidal shape, a Pt rich silicide cap region and an oxygen rich region.

2. The semiconductor structure of claim 1, further comprising a diffusion barrier portion and a metal contact located within each contact opening and atop said source-side contact structure and said drain-side contact structure.

3. The semiconductor structure of claim 1, wherein said functional gate structure is an n-type field effect transistor.

4. The semiconductor structure of claim 1, wherein said functional gate structure includes a U-shaped gate dielectric material portion surrounding a gate conductor material portion, wherein uppermost surfaces of said U-shaped gate dielectric material portion are coplanar with an uppermost surface of said gate conductor material portion.

5. The semiconductor structure of claim 1, wherein said substrate includes unalloyed silicon or a silicon alloy.

6. The semiconductor structure of claim 1, further comprising another device region located adjacent said device region containing said functional gate structure, wherein said another device region includes another Si-containing semiconductor material portion of said Si-containing substrate having another source region and another drain region located within said another Si-containing semiconductor material portion, wherein said another source region and said another drain region are spaced apart by another channel region, another functional gate structure located above said another channel region; said dielectric material located on each side of said another functional gate structure; other contact openings located in said dielectric material and extending to said another source region and said another drain region; another source-side contact structure located within one of said other contact openings and in contact with said another source region; and another drain-side contact structure located within another of said other contact openings and in contact with said another drain region, wherein said another source-side contact structure and said another drain-side contact structure each comprises a nickel monosilicide alloy body.

7. The semiconductor structure of claim 6, wherein said nickel monosilicide alloy body is separated from said another source region and said another drain region by platinum.

8. The semiconductor structure of claim 7, wherein said another functional gate structure is a p-type field effect transistor.

9. The semiconductor structure of claim 6, further comprising another diffusion barrier portion and another metal contact located within said other contact openings and atop said another source-side contact structure and said another drain-side contact structure.

10. The semiconductor structure of claim 6, wherein said another functional gate structure includes a U-shaped gate dielectric material portion surrounding a gate conductor material portion, wherein uppermost surfaces of said U-shaped gate dielectric material portion are coplanar with an upper surface of said gate conductor material portion.

11. The semiconductor structure of claim 1, wherein said Pt rich silicide cap region is entirely embedded within said nickel disilicide alloy body.

12. The semiconductor structure of claim 11, wherein said oxygen rich region includes a lower portion that is embedded within said nickel disilicide alloy body and an upper portion that is located above said nickel disilicide alloy body.

* * * * *